Oct. 13, 1964 G. J. KENNEDY 3,152,487

TUNING MECHANISM

Filed June 22, 1962 2 Sheets-Sheet 1

INVENTOR.
GILBERT J. KENNEDY

BY [signature]

AGENT

INVENTOR.
GILBERT J. KENNEDY
BY [signature]
AGENT

United States Patent Office
3,152,487
Patented Oct. 13, 1964

3,152,487
TUNING MECHANISM

Gilbert J. Kennedy, Jenkintown, Pa., assignor to Philco Corporation, Philadelphia, Pa., a corporation of Delaware Filed June 22, 1962, Ser. No. 204,337
9 Claims. (Cl. 74—10.41)

This invention relates to tuning devices and more particularly to improved mechanism for achieving presettable fine tuning.

The allocation by the FCC of seventy UHF channels covering the Americas has made it desirable, from the standpoint of both convenience and economy, to provide a single tuning mechanism by means of which a tuner of the continuously tunable type may be presettably indexed to any of the seventy stations lying within the assigned UHF band of from 470 to 890 megacycles.

The difficulty of accomplishing this end within a reasonably compact space has been compounded by the further desired requirements that the system be both fine tunable by the operator in a presettable manner and be capable of utilizing a conventional variable air condenser having a typical tuning range of approximately only 180° of arc. It will accordingly be seen, assuming the use of a condenser employing a linear-frequency blade configuration, that the size of the arcuate sector in which tuning of each channel may be effected comprises little more than two and one-half degrees of arc. The problem becomes still further complicated if other than linear-type blade configurations are used. In conformity with the requirements of present television packaging the control function is to be performed within as compact a space as possible. A still further requirement is that maximum permissible channel misalignment is of the order of approximately 150 kilocycles, equivalent to a repeatability tolerance factor of about .06° of arc. It will be seen that the provision of such a tuning device presents a problem of considerable magnitude, from both the standpoint of size and the precision of adjustment required to effect acceptable presettable detent tuning.

It is accordingly an object of this invention to provide a compact tuning device of simplified construction permitting presettable, precision tuning of a plurality of closely adjacent broadcast stations.

A further and more particularized object of the invention is to provide a detent-tuning mechanism which provides for automatic presetting of the fine tuning of a television receiver.

It is a still further object of the invention to provide a tuning device which is compact, inexpensive and simple in construction and one which permits manual return to preselected stations with a high degree of precision, while providing for continuous coarse and fine tuning in non-preset station areas.

It is another object of this invention to provide a detented UHF tuning device having a single knob control for both coarse alignment and fine tuning adjustment.

These, and other objects and features of the present invention will be apparent from a consideration of the following detailed description taken in conjunction with the accompanying drawings, in which.

Figures 1, 4, 5:
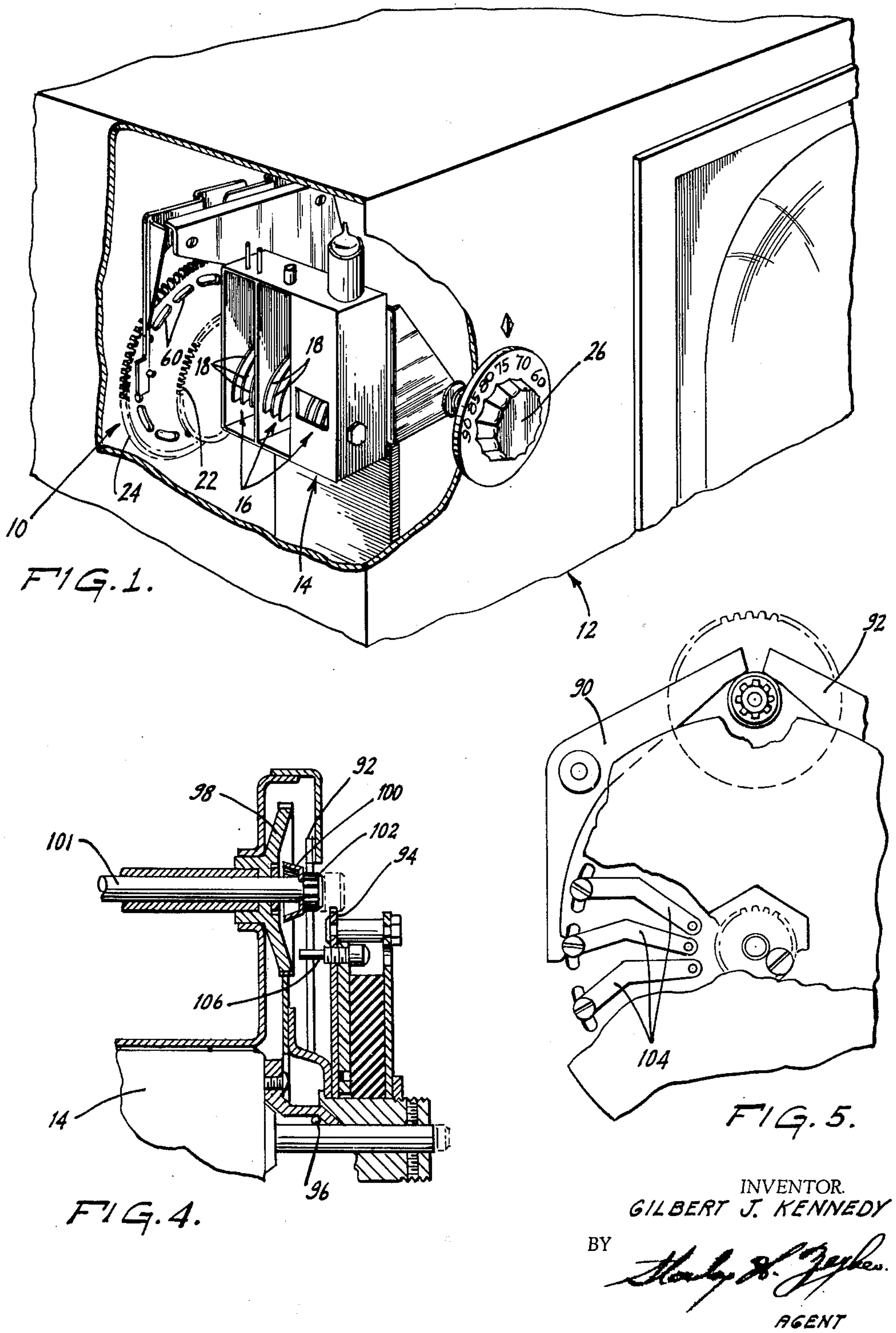
FIGURE 1 is a partial perspective showing of a television receiver embodying tuning apparatus of the present invention.
FIGURES 4 and 5 illustrate a modified construction designed to achieve certain refinements of operation hereinafter to be discussed.
Figures 2, 3:
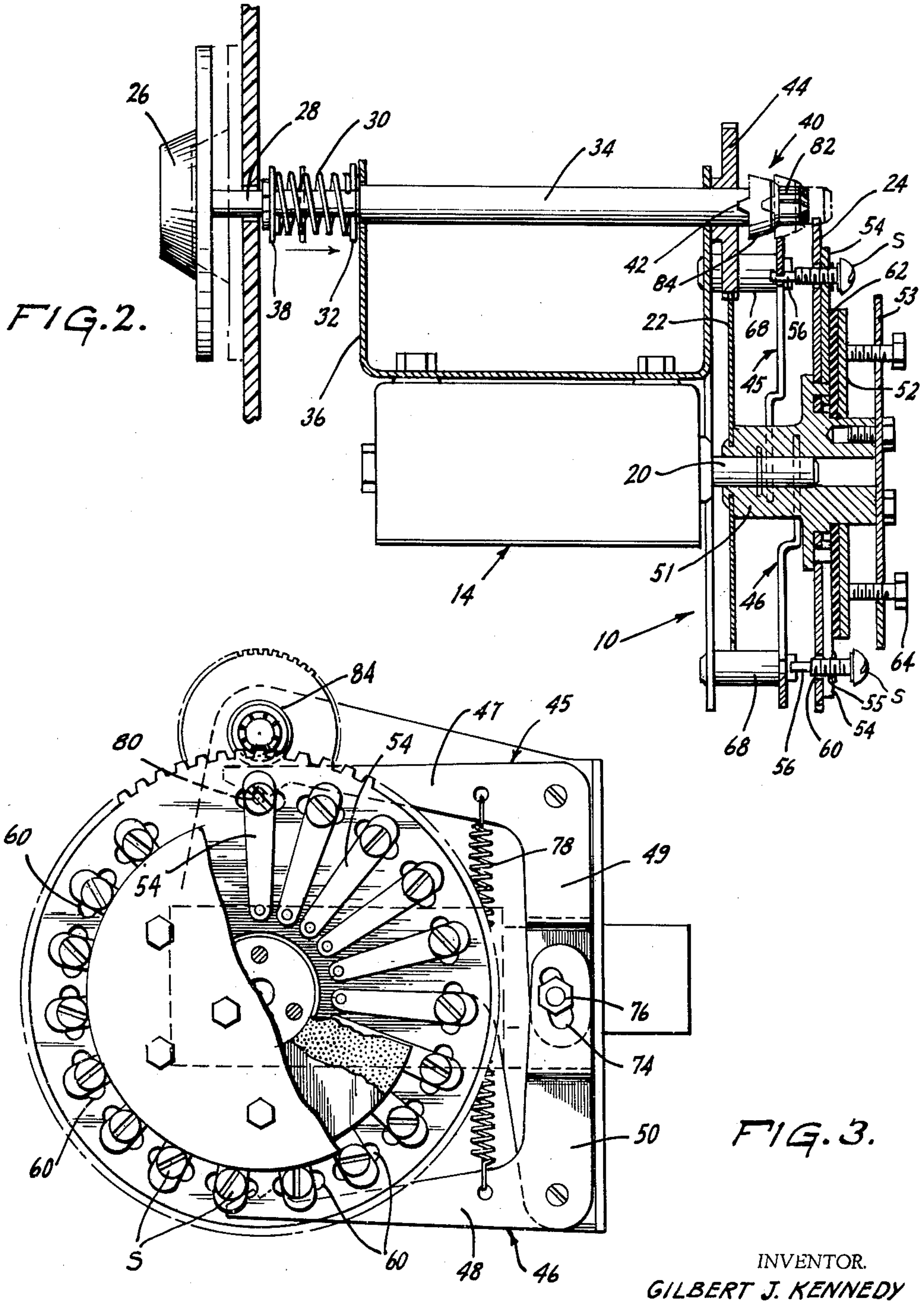
FIGURE 2 shows a sectionalized elevational view of the tuning device shown in FIGURE 1.
FIGURE 3 is a rear elevational view of the device illustrated in FIGURE 2, with parts broken away to show further details of construction.

Referring to FIGURE 1, the tuning mechanism is generally indicated by the numeral 10 and is shown adapted for use with a console type television receiver 12 embodying a tuner 14. Details of the mechanism's construction are shown in FIGURES 2 and 3. Tuner 14 is of the type which is continuously variable over its tunable range and is illustrated as consisting of a plurality of variable condenser units 16, the rotating plates 18 of which are carried on a common rotatable shaft 20 (see FIGURE 2). In accordance with the invention the tuner shaft 20 has fixedly secured thereto both a coarse tuning gear 22 and a fine tuning gear 24 adapted to be selectively operated, by means hereinafter described. Coarse tuning may be effected by rotating the knob 26 when shaft 28 is in its fully extended left-hand position shown in FIGURE 2. The knob is biased to the coarse tuning position by means of a compression spring 30 one end of which seats against a back up washer 32 carried by the tubular sleeve member 34, the washer being held against axial movement by abutment with supporting bracketry 36. The other end of the spring bears against a snap ring 38 seated within an annular groove provided on the shaft 28. Shaft 28 is rotatably journalled within the tubular sleeve 34 and is terminated at one end by a pinion 40 and toothed clutch jaw 42. Both these elements are fixedly secured to shaft 28 for movement therewith. The clutch jaw interdigitates with cooperative recesses provided in confronting edge portions of the tubular sleeve 34. Rotary-movement of shaft 28 is thereby transmitted through pinion 40 and the sleeve mounted drive pinion 44 to the coarse tuning gear 22. For purposes of illustration the tuner is one which is continuously tunable throughout a rotative arc of only 172°. The provision of means capable of providing precision indexing of a great number of channels within such a narrow span of arc, in as compact a space as possible, constitutes one of the salient features of the present invention. In order to limit the physical dimensions of the tuner, there is provided a detenting system consisting of two separate detent levers 45 and 46 each comprised of a bell crank member having horizontally disposed arms 47 and 48, as viewed in FIGURE 3, and vertical arms 49 and 50. These levers, acting in cooperation with presettable detent means, hereinafter to be described, permit precision tuning of the entire UHF transmission band using a continuously variable tuning element within an extremely compact circular area. One factor which has aided in the spatial compression made possible by this invention is the recognition that any UHF channel in any geographic area is spaced from any other channel in that area by a three-channel bandwidth. On this basis each detent station has been constructed to cover a four channel zone of operation permitting a substantial reduction in the size of the tuning mechanism required. Mechanism designed to accomplish detentable tuning of any of the UHF channels available within any geographic area, utilizing this principle, is described below. The tuning mechanism also embodies means permitting both presettable fine tuning by the operator and, in the event of movement from one geographic area to another, the release of previously preset stations and the substitution of others.

As seen in FIGURE 2 there is fixedly mounted to the tuner shaft 20 a hub member 51 to which there is secured the coarse and fine tuning gears 22 and 24, an axially translatable pressure plate 52 and a back-up late 53 the purposes of which will hereinafter be described. Also pivotally mounted to the hub are a plurality of indexing blades or leaves 54 (see FIGURE 3). The free-moving outer end of each of these leaves is provided with a threaded aperture 55 for accommodation of a screw S carrying an indexing pin 56. The body of the screw is threadedly engaged in aperture 55 to premit axial translation into interference with one or the other of the detent levers 45 or 46 when the channel represented by that particular pin is desired to be detented. When no detenting is desired the screw-carried pins are translated out of interference with the detent levers by withdrawing the screws S to a non-interfering position. The arc through which any leaf can pivot is delimited by confinement of the threaded body portion of the pin within an arcuate slot 60 cut in a confronting face portion of the fine tuning gear 24. The arcuate length of the slot is designed to span a four channel width for the reasons discussed above.

Each of the leaves is held in engagement with the confronting face of the fine tuning gear for rotative movement therewith, by adjustable holding means, one arrangement being to use a neoprene washer 62 sandwiched between the detent leaves 54 and pressure plate 52. The pressure exerted by the plate is adjustable through manipulation of screws 64 carried in back-up plate 53. By this means the force required to cause relative movement between the fine tuning gear 24 and the indexing leaves may be adjusted to fit the operating characteristics of the mechanism. Movement of the indexing leaf through its restricted arc of motion may be achieved by simply overcoming the frictional loading of the holding means. The reasons for this constructional arrangement will become apparent from what follows.

As indicated, detenting of desired channel selections is provided by a pair of detent levers or tongs 45 and 46, the detent-acting arms of which are displaced from each other by approximately 180°. The construction of the detent levers is most clearly shown in FIGURES 2 and 3 the levers being in the form of a bell crank the fulcrums of which are independently pivotally connected to the bracketry 36 through spacer members 68. The terminal portion of the vertically disposed arm 49, as seen in FIGURE 3, has a slot 74 provided therein, configured to accommodate an eccentric pin 76 secured to arm 50. The pin is rotatable relative to arm 50 to permit adjustment of the lever action. The horizontally disposed arms of the lever are urged toward each other by a straddling spring member 78 through which they are interconnected. This member provides for positive seating of the detent pin 56 in the lever detent notch 80 as clearly seen in FIGURE 3. This arrangement substantially widens the arc which is utilizable for indexing purposes over that which would normally be available using only a single detent position without substantial increase in the area which would be required for that purpose using conventional arrangements. In the illustrated instance the arc which is available for indexing a specified band of channels using a variable gang condenser which is tunable over only 170° of rotation is extended to about twice the angular arc, using the same diameter circle in which to carry out the indexing function, as would have been available using a single detent lever. This allows precision fine tuning of any of the seventy UHF channels located within any given geographic area to be carried out within a circular area having a diameter of less than four inches. By use of a plurality of detent positions constructed and arranged alternately to indicate successive channel positions a substantial widening of the area available for individual channel indexing is achieved without substantial increase in the area required for the total indexing function. As previously indicated the detent pin may be translated into interference with the detent levers whenever detenting is desired. To set up the detent pin representing the desired channel the pin is translated into a position which will enable it to be carried, through rotation of tuner shaft 20, into interference relation with one or the other of the detent levers. This is accomplished by rotating the tuner element through the coarse tuning gear train 22–44, to a position which places the pin in seating engagement with the appropriate detent notch, such for example as notch 80 of the upper detent arm 47 as shown in FIGURE 3. If, for example, the detent lever 45 is used in providing detent tuning of any one of channels 14, 15, 16 or 17 (only one of which channels is receivable in any particular geographic area as previously noted) then the opposing tong 46 is used in providing detent tuning of any one of the next group of four channels and so forth alternately until the entire band of UHF channels has been covered.

Once the coarse tuning position for a particular channel has been established the tuning knob 26 is pushed forward to the dashed-line position shown in FIGURE 2 over-riding the spring 30 and breaking the driving connection between the jaw clutch 42 and coarse tuning drive pinion 44. This action carries the pinion 40 into engagement with the fine tuning gear 24 and concurrently acts, through cam surface 84, formed on the jaw clutch 42, to prevent the detent lever 45 from being withdrawn from locking engagement with its associated detent pin 56, preventing movement of the latter. With the pin thus locked, the channel is fine tuned through movement of the fine tuning gear 24 relative to the locked detent pin, thereby to permit limited rotation of the tuner shaft relative to the anchored detent leaf. This is achieved by overriding the frictional loading exerted by the neoprene washer 62. Screws 64 permit adjustment of the loading force. Desirably, this force should be sufficient to enable slippage between the fine tuning gear and detent levers 54 by application of a moderate turning movement to knob 26 while providing sufficient force to prevent lateral dislodgement of the pin from its preset position as it rides into a detent station. In this way, there is restricted realtive movement of each leaf-carried pin 56 with respect to its associated slot or opening 60 in gear 24, and consequent fine tuning preset of the mechanism. When fine tuning has been completed the knob 26 is released and the tuning shaft is returned to its extended rest position by the action of spring 30. This releases the pin in its preset position and leaves the pin free to move with the fine tuning gear on rotation of the tuning knob to the next desired channel selection. Each channel may be thus coarse and fine tuned and the detent automatically preset using a single knob control.

By anchoring the pin in its detented position while permitting micrometer adjustment of the fine tuning gear through manipulation of the small pinion gear 82, there is provided, by a simple one-step procedure, both fine tuning and automatic fine tuning preset. Once this indexing procedure has been carried out for a particular channel the tuner may be repeatedly returned to that channel by simply rotating the tuning knob, while in its coarse tuning position, until the pin drops into the preset detented position.

By employment of the constructional arrangement discussed above and through resort to a staggered detent action, such as provided, for example, by the detent tong arrangement shown in FIGURE 3, the indexing function for a tuner having a tunable range of only 172°, may be spread over more than 340° of arc.

A modified version of the tuning mechanism is shown in FIGURES 4 and 5. The illustrated mechanism embodies the same operating principles already discussed but incorporates refinements of construction designed to increase the detent feel while concurrently insuring accurate fine tuning preset. In achieving that degree of detent feel which is subjectively acceptable as, for example, by increasing the spring loading on the detent pawls, it is necessary, if precision present is to be maintained, that the system be kept free of objectionable shift or backlash on release of the pawl from the fine tuning mode. The tendency of the tuner to shift out of its fine tuned setting on release of the pawl has been termed "fine tuning recoil" and results from overstress of the component parts resulting from forces set up during the fine tuning phase of operation. When using the heavier detent forces required to accent the detent feel it is necessary to greatly increase the frictional loading exerted on the leaves carrying the detent pins in order to prevent their dislodgement in moving into or out of their preset detent position. This is necessitated as a result of the increase in the radial component of forces developed by the detent lever caused by an increase in the pawl spring force. Since presettable fine tuning requires movement of the fine tuning gear relative to the detent pin, distorting forces necessary to the accomplishment of this end are set up within the mechanism which if not properly neutralized or countered produce backlash between the tuner shaft and knob shaft on release of the tuning knob. It has been found that fine tuning recoil is caused primarily by distortions which appear in three major areas of the tuning mechanism, the detent pawl bracketry and pivots, the detent pins and leaves, and the tuner shaft. To prevent such distortions the detent levers 90 and 92 may be strengthened in the pivot areas as for example by using heavier stock material, by ribbing or by constructing the levers from channeled material. To reduce the moment arm through which the forces act in inducing tuner shaft distortions, the spacing between the large fine tuning gear 94 and tuner shaft bearing 96 is decreased over that which is shown in the construction disclosed in FIGURE 2. In accomplishment of the objective the coarse tuning drive gear 98 is dished to permit the cam element 100 and fine tuning pinion 102 to be moved to the left thus providing room to move the fine tuning gear 94 closer to the tuner bearing 96. To provide still closer alignment between the bearing and fine tuning gear the bearing is mounted outboard of the tuner 14. To limit and better control the forces transmitted to the pawl through the cam element 100 the cam is made of spring steel formed in the shape of a cup. This construction effectively interposes between the knob shaft 101 and pawls a resilient member capable of exerting a more controlled force on the pawls. As seen in FIGURE 5 the pawls are pivoted at their fulcrum point much the same as they were in the construction shown in FIGURES 2 and 3, the camming force, however, is applied to the pawl at a point remote from that at which the detent action occurs.

A further refinement of construction is to curve the detent leaves 104 (FIGURE 5) effectively to provide a greater leaf width to prevent leaf roll caused by detent loading of the pin 106. Reduction in the length of the detent pin is also helpful in this connection and in reducing the magnitude of the moment transmitted to the detent pin leaf. It will accordingly be seen that numerous structural modifications may be reverted to in achieving certain enhancements of operation without changing the fundamental principles on which the invention is predicated.

In summary there is provided a unique tuning mechanism permitting precision fine tuning in a manner providing automatic preset using a single knob control and which utilizes, in combination therewith, a novel detent system permitting optimum use of the space available for the accomplishment of these ends.

While preferred forms of the present invention have been depicted and described, it will be understood by those skilled in the art that the invention is susceptible of changes and modifications without departing from the essential concepts thereof, and that such changes and modifications are contemplated as come within the terms of the appended claims.

I claim:

1. In a manually operable tuning device having a tunable channel selector driven by rotatable shaft means, means providing for tuning of said channel selector to any one of a large number of channels by effecting precise presettable adjustment of said shaft means to a predetermined desired channel which means comprises: a detent; structure defining a plurality of detentable elements each corresponding to an angular increment to the total arc of revolution permitted said shaft means and each being capable of translation into or out of interference relation with said detent; adjustment means providing vernier control of the position of said shaft means and having a positional range of adjustment delimited at any detented station to a predetermined small number of the channels to which said selector may be tuned; means for effecting movement of said shaft progressively through a plurality of detent positions; and means permitting relative movement between a detented element and said shaft means whereby the detented element is automatically preset, during vernier positioning of said shaft means to a desired channel included in the relatively small number of channel positions provided by said adjustment means at that detented station, to effect selection on return to that detent station of said channel.

2. In a manually operable tuning device having a tunable channel selector driven by rotatable shaft means, mechanism providing for tuning of said channel selector to any one of a plurality of channels by effecting precise adjustment of said shaft means to predetermined angular positions, said mechanism comprising: structure defining a detent; adjustment means providing vernier control of the position of said shaft means for fine tuning said channel selector; indexing means adapted for movement in correspondence with said shaft means and including a plurality of indexing elements adjustable into detenting engagement with said detent for positioning said shaft means at predetermined locations; and means for locking a detented indexing element against rotation with said shaft means during fine tuning of said channel selector to a particular channel, automatically to preset said detented element in a position corresponding to the fine tuned position of that particular channel.

3. In a manually operable tuning device having a tunable channel selector driven by rotatable shaft means, mechanism providing for tuning of said channel selector to any one of a plurality of channels by effecting precise adjustment of said shaft means to predetermined angular positions, said mechanism comprising: structure defining a detent; indexing means frictionally held for movement in correspondence with the movement of said shaft means and including a plurality of indexing elements adjustable into interference relation with said detent for positioning said shaft means at predetermined locations; adjustment means providing vernier control of the position of said shaft means for fine tuning said channel selector; means for effecting movement of said shaft means progressively through a series of detentable positions; and means for locking an indexing element in its detented position against rotation with said shaft means during fine tuning of said channel selector to a particular channel whereby automatically to preset said detented indexing element in a position corresponding to said channel.

4. Tuning mechanism comprising: a variable tuning element coupled to rotatable shaft means for movement thereby; structure defining a detent; indexing means adapted for movement in correspondence with the movement of said shaft means and including a plurality of indexing elements adjustable into interference relation with said detent for positioning said shaft at predetermined locations; holding means permitting relative movement between said indexing means and said shaft means through a positional range corresponding to a predetermined small number of the tuning stations to which said variable tuning element may tuned; means for effecting movement of the detent-interfering indexing elements progressively into registration with said detent; adjustment means permitting vernier control of the position of said shaft means for fine tuning said variable tuning element; and means for anchoring an indexing element in its detented position to permit slippage of said holding means during fine tuning adjustment of said variable tuning element whereby automatically to preset said indexing element in a position permitting detentable fine tuning of the station represented by said indexing element on return thereof to its detented position.

5. Tuning mechanism comprising: a tunable channel selector driven by rotatable shaft means; structure defining a detent; indexing means adapted for movement in correspondence with the movement of said shaft means and including a plurality of indexing elements adjustable into interference relation with said detent for positioning said shaft at predetermined locations; rotatable means for effecting transport of detent-interfering indexing elements progressively into registration with said detent; adjustment means permitting vernier control of the position of said shaft means for fine tuning said channel selector; and means for locking a detented indexing element against movement with said shaft means during fine tuning adjustment of said tunable channel selector whereby automatically to preset said indexing element in a position permitting fine tuning of said selector on return of said indexing element to its detented position.

6. In a manually operable tuning device having a channel selector tunable by rotatable shaft means, mechanism providing for tuning of said channel selector to any one of a plurality of channels by effecting precise adjustment of said shaft means to predetermined angular positions, said mechanism comprising: structure defining a detent; an indexing wheel movable in correspondence with said shaft means and including a plurality of indexing elements individually adjustable into or out of interference relation with said detent for positioning said shaft at predetermined locations and each element being adjustable through an arc corresponding to a predetermined small number of channels to which said selector may be tuned; translational means for effecting movement of detent-interfering indexing elements progressively into registration with said detent; adjustment means permitting vernier control of the position of said shaft means for fine tuning said channel selector; and means for locking an indexing element in its detented position against movement with said shaft means on fine tuning of said channel selector to a desired channel included within the small number of channels to which that element is adjustable automatically to preset said detented indexing element in a position corresponding to the fine tuned position of that particular channel.

7. In a manually operable tuning device having a tunable channel selector driven by rotatable shaft means, mechanism providing for tuning of said channel selector to any one of a plurality of channels by effecting precise adjustment of said shaft means to predetermined angular positions, said mechanism comprising: structure defining a detent; indexing means comprising a series of indexing leaves each equipped with an indexing pin translatable into interference relation with said detent for positioning said shaft at predetermined locations and each leaf being pivotable through an arc corresponding to a predetermined small number of channels to which said selector may be tuned; holding means interposed between said indexing leaves and said shaft means and normally operative to provide movement of said leaves in correspondence with said shaft means for effecting movement of translated indexing pins progressively into registration with said detent; adjustment means permitting vernier control of the position of said shaft means for fine tuning of said channel selector to a desired channel; and means for overriding said holding means to prevent a detented element from moving with said shaft means during fine tuning of said channel selector automatically to preset said detented indexing pin in a position corresponding to that of the particular channel selected.

8. In a manually operable tuning device having a tunable channel selector driven by rotatable shaft means, means providing for tuning of said channel selector to any one of a large number of channels by effecting precise adjustment of said channel means to predetermined desired channels, which means comprises: structure defining a plurality of detents; indexing means including a plurality of indexing elements disposed in interference relation with said detents for positioning said shaft means at predetermined locations; holding means interposed between said indexing means and said shaft means and normally operative to move said indexing means in correspondence with said shaft means; means for effecting movement of detent-engaging indexing elements progressively into registration with alternate ones of said detents; adjustment means permitting vernier control of the position of said shaft means for fine tuning of said selector to a desired channel; and means for overriding said holding means to prevent a detented indexing element from moving with said shaft means during fine tuning of said selector automatically to preset said detented indexing element in a position corresponding to the fine tuned position of that particular channel.

9. In a manually operable tuning device having a tunable channel selector driven by rotatable shaft means, means providing for tuning of said channel selector to any one of a large number of channels by effecting precise detentable adjustment of said shaft means to predetermined desired channels, which means comprises: structure defining a pair of opposed detents; indexing means including a plurality of indexing pins adjustable into engagement with said detents for positioning said shaft means at predetermined locations; a holding means interposed between said indexing means and said shaft means and normally operative to move said indexing means in correspondence with said shaft means; means for effecting movement of detent-engaging indexing pins progressively into registration with said detents alternately; adjustment means permitting vernier control of the position of said shaft means for fine tuning of said selector to a desired channel; and means for overriding said holding means to prevent a detented indexing pin from moving with said shaft means during fine tuning of said selector automatically to preset said indexing pin in a position corresponding to the fine tuned position of that particular channel.

References Cited in the file of this patent

UNITED STATES PATENTS

| | | |
|---|---|---|
| 2,248,678 | Glaser et al. | July 8, 1941 |
| 2,442,935 | Richards | June 8, 1948 |
| 2,594,667 | Lytle et al. | Apr. 29, 1952 |